US008026725B2

(12) United States Patent
Dalke

(10) Patent No.: US 8,026,725 B2
(45) Date of Patent: Sep. 27, 2011

(54) OPTICAL FIBER COUPLED ANTENNA CURRENT MONITOR

(76) Inventor: James A. Dalke, Bellevue, WA (US)

( * ) Notice: Subject to any disclaimer, the term of this patent is extended or adjusted under 35 U.S.C. 154(b) by 239 days.

(21) Appl. No.: 12/270,789

(22) Filed: Nov. 13, 2008

(65) Prior Publication Data

US 2009/0121950 A1 May 14, 2009

Related U.S. Application Data

(60) Provisional application No. 61/002,846, filed on Nov. 13, 2007.

(51) Int. Cl.
*G01R 31/08* (2006.01)
*G01R 25/00* (2006.01)

(52) U.S. Cl. ..................................... 324/522; 324/76.77

(58) Field of Classification Search .................. 324/522, 324/348, 713, 76.11, 71.1, 177, 555; 702/1, 702/64, 79; 73/79
See application file for complete search history.

(56) References Cited

U.S. PATENT DOCUMENTS 5,349,357 A * 9/1994 Schurmann et al. ............ 342/51
5,999,889 A * 12/1999 Tietsworth ...................... 702/65
6,011,476 A * 1/2000 Afilani ....................... 340/573.1
6,373,623 B1 * 4/2002 Ohshima et al. ........... 359/341.3
7,224,170 B2 * 5/2007 Graham et al. ............... 324/522
7,309,851 B2 * 12/2007 Huang et al. .................. 250/205

FOREIGN PATENT DOCUMENTS

JP 2002098751 A * 4/2002

OTHER PUBLICATIONS

Machine Translation of JP 2002098751 A.*

* cited by examiner

*Primary Examiner* — Hoai-An D Nguyen
(74) *Attorney, Agent, or Firm* — Christensen O'Connor Johnson Kindness PLLC

(57) ABSTRACT

A system for sensing the amplitude and phase of an RF current flowing in an antenna element of a directional antenna system that uses a sampling device such as a current sample loop that is connected to an antenna monitor with fiber optic cable. The system uses an interface at the current sample loop on each of the antenna elements to convert an RF current sample to an optical signal. The fiber optic cable transmits the optical signal to the antenna monitor where it is converted back to an electrical signal for appropriate phase and amplitude comparison with the RF currents sampled from other antenna elements in the directional antenna system.

13 Claims, 5 Drawing Sheets

OPTICAL FIBER COUPLED ANTENNA CURRENT MONITOR

CROSS-REFERENCE TO RELATED APPLICATION

This application claims the benefit of U.S. Provisional Application No. 61/002,846, filed Nov. 13, 2007, entitled OPTICAL FIBER COUPLED ANTENNA CURRENT MONITOR, the disclosure of which is hereby expressly incorporated by reference, and the filing date of which is hereby claimed under 35 U.S.C. §119(e).

BACKGROUND

Designing, constructing, and operating today's AM directional array is becoming increasingly sophisticated and complex. There are increasing demands for new stations and better coverage from increasingly challenging physical locations. Today, there are nearly 5,000 licensed AM stations in the United States. Over 1,800 of these are licensed for directional operation. At this time there are a little more than 500 construction permits outstanding for new and modified directional facilities and over 900 applications for construction permits.

The opportunities for these new and improved facilities are made possible by sophisticated computer programs that can analyze existing licensed station coverage or proposed coverage as well as the FCC rules providing protection for stations on the same frequency and adjacent frequencies, and signal propagation to produce intricate antenna patterns. These patterns can then be analyzed to produce physical antenna array specifications and electrical networks to maximize coverage.

An important part of adjusting and maintaining an AM directional antenna system is accurately monitoring the phase and amplitude of the RF current in each directional element in the antenna array. A conventional method of sampling the phase and amplitude is with a sampling coil or loop positioned off the antenna tower that is connected by a coaxial cable to an antenna monitor. In order to avoid coupling to the base of the antenna tower, the coaxial cable leading to the sampling coil is wound into a high impedance choke. In addition, it is generally necessary to ensure that the coaxial cables that extend from the antenna monitor to the sampling coil on each of the towers are the same length and are subject to the same environmental conditions. This is typically accomplished by burying the coils of coaxial cables underground. The result is often a mass of cables that must be maintained and periodically inspected to ensure that the differences in the signals measured at the antenna monitor are due variations in the current flowing within the antenna towers themselves and not due to differences in the coaxial cables. Given these problems, there is a need for an easier method of determining the current and phase in antenna elements of a directional broadcast antenna.

SUMMARY

To address the above problems, the present invention replaces the traditional coaxial cables that connect a sampling device to an antenna monitor with fiber optic cables. In one embodiment, the system uses an interface at a current sampling loop on each of the antenna elements to convert an RF current sample to an optical signal. A fiber optic cable is then used to transmit the optical signal to the antenna monitor for appropriate phase and amplitude comparison with the RF currents flowing in the other antenna elements of the antenna system. The use of the fiber optic cable eliminates the need for decoupling at the base of each antenna element and eliminates the temperature stability problems associated with coaxial sample lines. Installation of the smaller fiber optic cables is also easier than installing coaxial cables.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

As discussed above, the technology disclosed herein relates to a system for detecting the amplitude and phase of current flowing in an antenna element. In accordance with one preferred embodiment, the system is used to detect the amplitude and phase of current flowing through an AM broadcast tower. However the technology could be used to detect the current flowing in other types of antennas as well.

Figure 1:
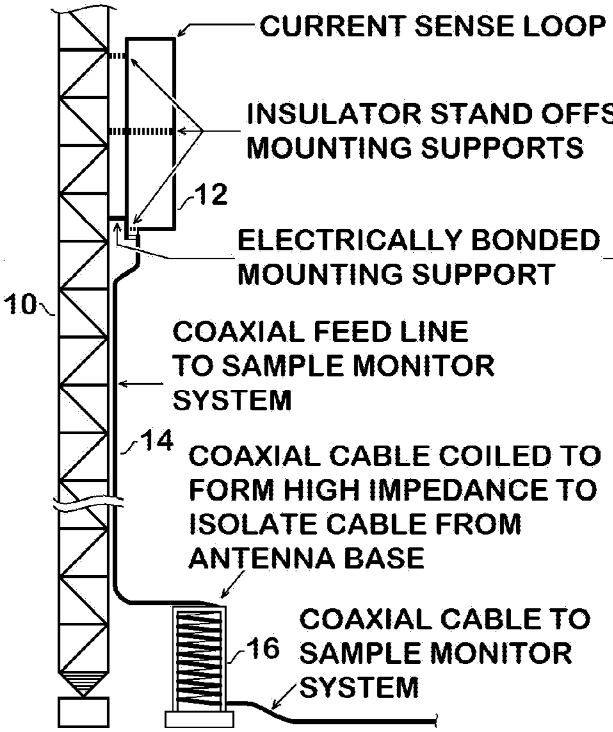
FIG. 1 (PRIOR ART)
FIG. 1 illustrates a conventional system for monitoring the amplitude and phase of RF current flowing in an antenna tower.

FIG. 1 illustrates a conventional system for detecting the magnitude and phase of an RF current flowing in an antenna element of a directional antenna system. In the example shown, an antenna element comprising an antenna tower 10 has a current sampling device mounted thereon that comprises a single current sense loop 12. The loop 12 has one end coupled to an outer conductor of a coaxial cable 14 and another end coupled to the center conductor of the coaxial cable 14. The coaxial cable 14 is wound into a high impedance choke 16 at the base of the tower 10 to prevent the strong signals broadcast from the tower 10 from inducing currents into the coaxial cable 14. The coaxial cable 14 leads to an antenna monitor (not shown) that receives RF current samples from other antenna elements that are delivered by other coaxial cables. The antenna monitor is used to compare the relative power and phase of the broadcast signals transmitted from each antenna element in the directional antenna system in order to adjust the radiation pattern of the antenna system as desired.

Figure 2:
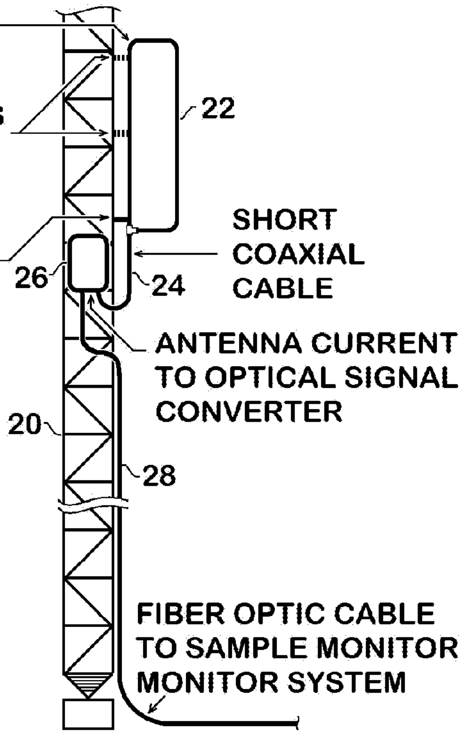
FIG. 2 illustrates a system for monitoring the amplitude and phase of RF current flowing in an antenna tower in accordance with one embodiment of the present invention.

FIG. 2 illustrates a system for detecting the amplitude and phase of an RF current flowing in an antenna element in accordance with one embodiment of the present invention. In the embodiment shown, a current sensor comprises a single current sense loop 22 that is secured to the antenna tower 20 at approximately ⅓ of the height of the tower. The dimensions of the single current sense loop 22 may depend on the amount of power transmitted by the antenna. However for Medium Frequency (MF) transmissions e.g. 530-1700 kHz, a suitable loop is made of a conductive material (e.g. ½" copper piping) that forms a rectangle approximately 5 feet high and 1 foot wide. The conductive loop includes a gap that defines the ends of the single loop coil. The single current sense loop 22 has one end coupled to an outer conductor of a short length of coaxial cable 24 and the other end of the single loop coil is coupled to the center conductor of the coaxial cable. The coaxial cable 24 leads to a junction box 26 that includes circuitry for converting a current that is induced into the single current sense loop 22 into a corresponding light signal that can be transmitted through a fiber optic cable 28 to an antenna monitor (not shown). The fiber optic cable 28 is generally immune to coupling from the antenna tower 20 and therefore can be routed directly to the antenna monitor. In addition, the fiber optic cable 28 is much less affected by weather conditions thereby eliminating the requirement that the fiber optic cables from each antenna element in the antenna system be environmentally matched.

Figure 3:
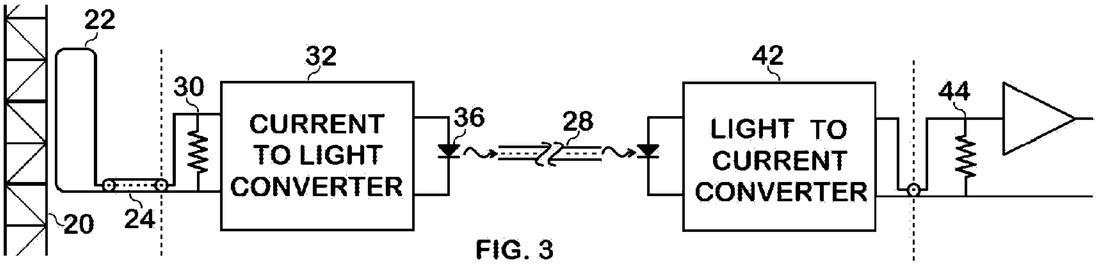
FIG. 3 illustrates one circuit for converting a sensed RF current into a light signal that is transmitted through a fiber optic cable in accordance with an embodiment of the present invention.

FIG. 3 shows one embodiment of a circuit within the junction box 26 for converting a current induced into the single current sense loop 22 into an optical signal that can be transmitted through the fiber optic cable 28. In this embodiment, the short coaxial cable 24 is terminated with a resistor 30 having an appropriate value for the type of coaxial cable used such as 50 ohms. A current-to-light converter circuit 32 converts a voltage produced across the resistor 30 into a driving signal that drives a light source 36 such as a light emitting diode (LED) or a laser diode. Light from the light source is directed into the optical fiber 28 for transmission to a light-to-current converter circuit. In one embodiment, the light-to-current converter circuit converts light received on the fiber optic cable 28 back into an electrical signal for use by the antenna monitor and computer to determine the relative amplitude and phase of the broadcast signals to be transmitted by the antenna tower 20.

In one embodiment, the current-to-light converter circuit 32 comprises an amplifier that drives the light source 36 directly to produce light with an intensity that is proportional to the amplitude of the sensed RF current. In another embodiment, the current-to-light converter circuit 32 includes an analog-to-digital converter circuit with, for example, a serial output that converts the analog voltage produced across the resistor 30 into a digital value proportional to the amplitude of the sensed RF current. The output of the A/D converter feeds a pulse modulator circuit that drives the light source 36 to produce a pulse modulated signal representative of the phase and amplitude of the sensed RF current.

In yet another embodiment, the current-to-light converter circuit 32 varies the frequency and/or phase of a time varying light signal in a manner similar to FM or phase modulation. The frequency or phase modulated light signal is carried by the fiber optic cable 28 to the light-to-current converter 42, which converts the modulated light signal into a electrical signal that is used by the antenna monitor and computer to adjust the power and phase of the broadcast signals transmitted by the tower 20 to adjust the radiation pattern of the antenna system.

In each of the illustrative embodiments of the current-to-light converters described, the circuitry for converting the sensed RF current into a light signal for transmission by the fiber optic cable can be powered using a power supply connected to the electrical power that is delivered to the tower 20. For example, power is typically provided for safety lights or other electrically powered devices carried on the antenna towers. Alternatively, the current-to-light converter circuitry could be battery powered. The batteries could be replaceable or rechargeable, for example, by a solar cell.

Figure 4:
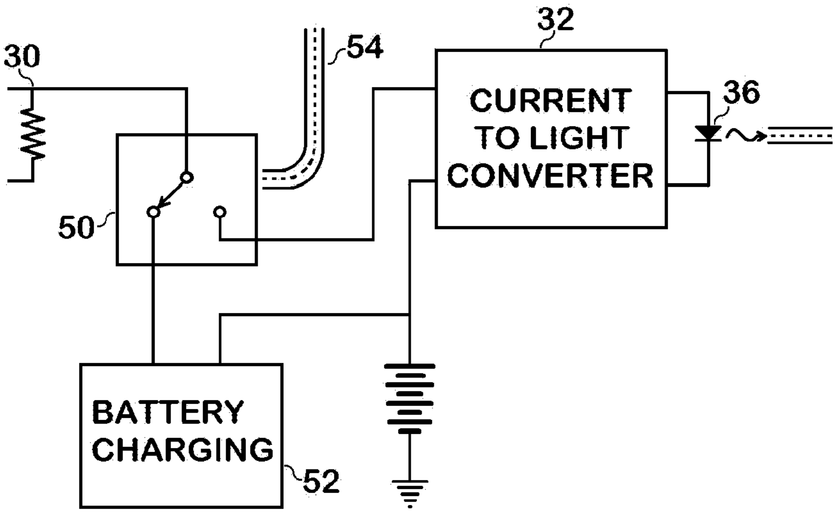
FIG. 4 illustrates an embodiment of the invention that uses a sampled RF current to selectively charge a battery that powers a current-to-light converter.

In another embodiment as shown in FIG. 4, the sensed RF current induced in the single current sense loop 22 can be rectified and used to charge the battery. In this case, the induced current is connected by a switch 50 to either a battery charging circuit 52 or to the current-to-light converter 32 that converts the sensed RF current into a light signal. In one embodiment, the switch 50 is an optical switch that is controlled with an optical signal carried to the junction box 26 by a second optical fiber 54. A light signal is transmitted on the second optical fiber 54 from the antenna monitor circuit that changes the position of the switch 50 to connect the sensed RF current to the current-to-light converter 32 when it is desired to read the sampled RF current at the antenna monitor or to the battery charging circuit 52 when it is desired to recharge the battery.

Figure 5:
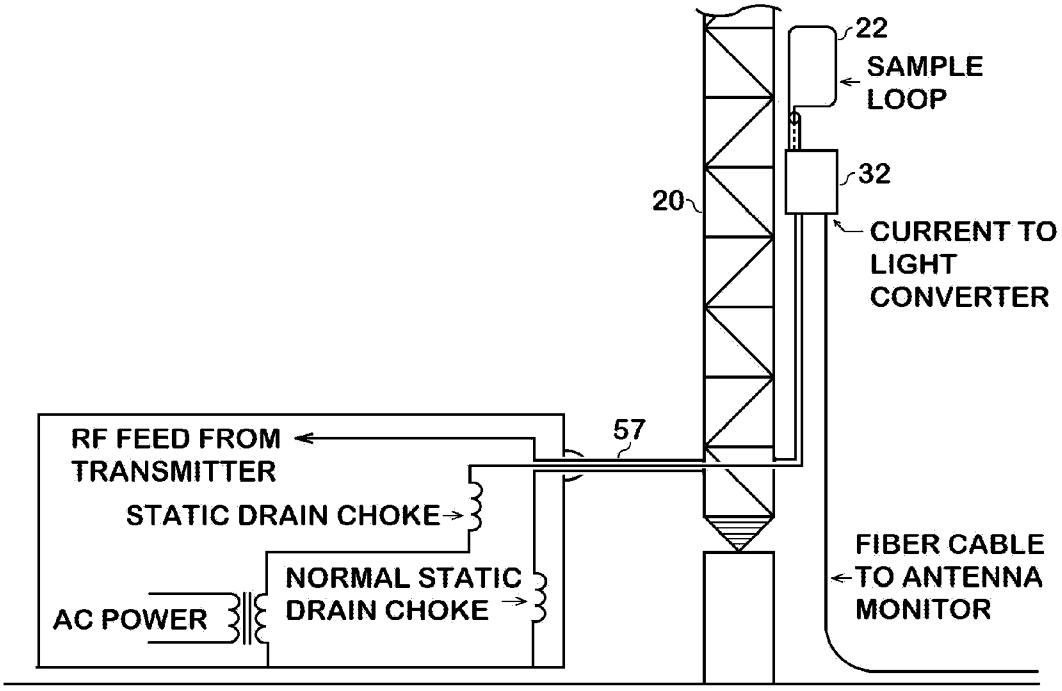
FIG. 5 illustrates another embodiment of the invention that uses a low voltage AC signal to power a current-to-light converter.

In the embodiment shown in FIG. 5, electrical power can be provided to the current-to-light converter 32 using a low voltage transformer 56. An AC power signal can be routed through a metal (e.g., copper) feed tube 57 that connects the transmitter (not shown) to the antenna tower 20 to shield the AC signal from transmissions form the antenna tower 20.

Figure 6:
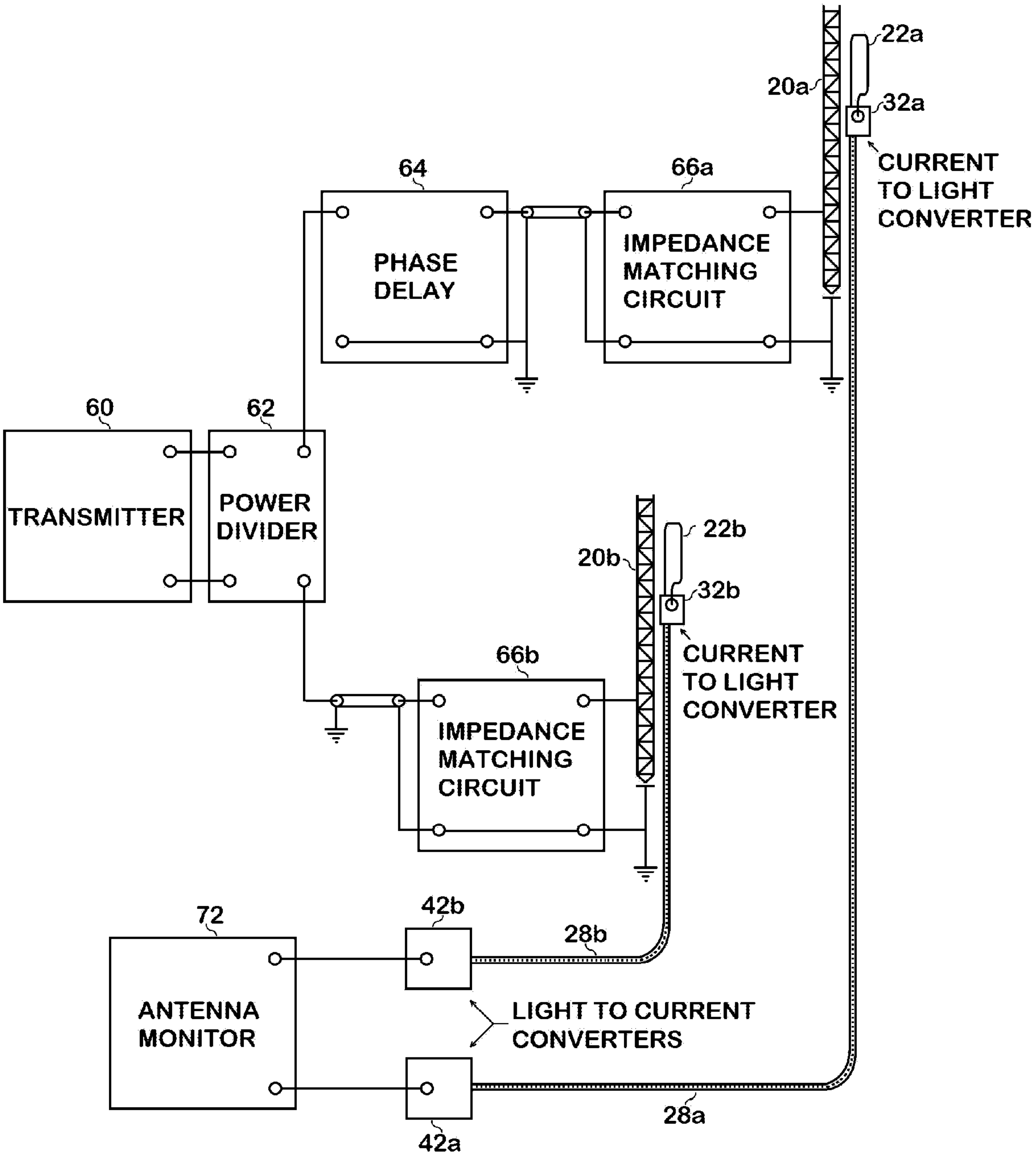
FIG. 6 illustrates a system for monitoring and adjusting the power and phase of signals transmitted by antenna elements of a directional antenna system in accordance with an embodiment of the present invention.

FIG. 6 shows the components of a system for adjusting the power and phase of broadcast signals transmitted from an antenna element in accordance with one embodiment of the present invention. The system includes a transmitter 60 and a power divider 62 that divides the power of the transmission signals among two or more antenna elements **20*a*, 20*b*. Each of the antenna elements 20*a*, 20*b* is connected to the transmitter 60 by an impedance matching circuit 66*a*, 66*b*. At least one of the antenna elements has a phase delay component 64** connected in-line with the antenna element that is adjustable to control the phase of the signals transmitted from the antenna element.

To sample the RF currents flowing in each of the antenna elements, each antenna element has a current sensor such as a single current sense loop **22*a*, 22*b* and a current-to-light converter 32*a*, 32*b*. Light signals produced by the current-to-light converters are transmitted through fiber optic cables 28*a*, 28*b* to an antenna monitor 72. The antenna monitor 72** and an associated computer (not shown) compare the amplitude and phase of the RF currents sensed in each of the antenna elements in order to adjust the power and phase of the signals to be transmitted from each antenna element. The details of the antenna monitor and associated computer are considered to be known to those of ordinary skill in the art and therefore are not discussed in further detail.

While illustrative embodiments have been illustrated and described, it will be appreciated that various changes can be made therein without departing from the scope of the invention. For example, although the described embodiments use a single current sense loop mounted on the antenna tower as a current sensor to sense the current flowing in the tower, it will be appreciated that a torroidal coil placed around the feed line to the antenna or an in-line transformer placed in series with the feed line could be used to sense the current flowing in the antenna tower. The outputs from the torroidal coil or the in-line transformer can be converted to a light signal that is transmitted through a fiber optic cable to the antenna monitor circuit in the manner described above. Therefore the scope of the invention is to be determined from the following claims and equivalents thereof.

The embodiments of the invention in which an exclusive property or privilege is claimed are defined as follows:

1. A system for monitoring current in two or more antenna elements, comprising:

current sensors configured to produce respective electrical signals that are proportional to an amplitude and phase of a current flowing in respective antenna elements of the two or more antenna elements;

current-to-light converters configured to convert the respective electrical signals produced by the current sensors into respective optical signals; and fiber optic cables configured to carry the respective optical signals to an antenna monitor, wherein the antenna monitor is configured to compare the respective amplitude and phase of the current flowing in the two or more antenna elements.

2. The system of claim 1, wherein at least one of the current sensors is a current sense loop that is positionable adjacent the respective antenna element such that transmissions from the antenna element induce a current in the current sense coil that is proportional to the amplitude and phase of the current flowing in the antenna element.

3. The system of claim 1, wherein at least one of the current-to-light converters configured to convert the respective electrical signal produced by at least one of the current sensors includes an amplifier and a light source that produces at least one of the optical signals with an intensity proportional to the amplitude of the electrical signal produced by the current sensor.

4. The system of claim 1, wherein at least one of the current-to-light converters includes an analog-to-digital converter that produces a digital code with a value that represents the electrical signal produced by at least one of the current sensors.

5. The system of claim 1, wherein at least one of the current-to-light converters includes a modulator circuit that produces at least one of the optical signals having a frequency and/or phase that varies in proportion to the electrical signal produced by at least one of the current sensors.

6. The system of claim 1, further including a power supply for at least one of the current-to-light converters that is powered by electrical power delivered to the respective antenna element.

7. The system of claim 1, further including a battery for powering at least one of the current-to-light converters.

8. The system of claim 7, wherein the battery is rechargeable.

9. The system of claim 8, wherein the battery is rechargeable by a solar panel mountable on the respective antenna element.

10. The system of claim 8, wherein the battery is rechargeable from the electrical signal produced by at least one of the current sensors.

11. The system of claim 10, further comprising a battery charging circuit and a switch for selectively directing the electrical signal to the respective current-to-light converter or to the battery charging circuit.

12. The system of claim 11, wherein the switch is responsive to a light signal received on a second optical fiber to direct the electrical signal to the battery charging circuit or the current-to-light converter.

13. A system for monitoring current in two or more antenna elements, comprising:

means for sensing an amplitude and phase of a current flowing in respective antenna elements of the two or more antenna elements means for converting the sensed current into respective optical signals; and fiber optic cables configured to carry the respective optical signals to an antenna monitor, wherein the antenna monitor is configured to compare the respective amplitude and phase of the current flowing in the two or more antenna elements.

* * * * *

UNITED STATES PATENT AND TRADEMARK OFFICE

CERTIFICATE OF CORRECTION

PATENT NO. : 8,026,725 B2
APPLICATION NO. : 12/270789
DATED : September 27, 2011
INVENTOR(S) : J. A. Dalke It is certified that error appears in the above-identified patent and that said Letters Patent is hereby corrected as shown below:

| COLUMN | LINE | ERROR |
|---|---|---|
| 5 (Claim 2, | 27 line 4) | "sense coil" should read --sense loop-- |

Signed and Sealed this
Twenty-first Day of February, 2012

David J. Kappos
*Director of the United States Patent and Trademark Office*